United States Patent
Li et al.

(10) Patent No.: US 12,191,411 B2
(45) Date of Patent: Jan. 7, 2025

(54) SEMICONDUCTOR SUBSTRATE, SOLAR CELL, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Huimin Li, Zhejiang (CN); Menglei Xu, Zhejiang (CN); Jie Yang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 31 days.

(21) Appl. No.: 17/872,035

(22) Filed: Jul. 25, 2022

(65) Prior Publication Data
US 2023/0411543 A1    Dec. 21, 2023

(30) Foreign Application Priority Data
Jun. 21, 2022 (CN) .......................... 202210704732.3

(51) Int. Cl.
*H01L 31/0236*     (2006.01)
*H01L 31/0216*     (2014.01)
(Continued)

(52) U.S. Cl.
CPC .. *H01L 31/02366* (2013.01); *H01L 31/02168* (2013.01); *H01L 31/03529* (2013.01);
(Continued)

(58) Field of Classification Search
CPC ......... H01L 31/02168; H01L 31/02363; H01L 31/02366; H01L 31/03529;
(Continued)

(56) References Cited

U.S. PATENT DOCUMENTS

| 6,210,991 B1 | 4/2001 | Wenham et al. |
| 2010/0218818 A1 | 9/2010 | Kang et al. |

(Continued)

FOREIGN PATENT DOCUMENTS

| AU | 2022206808 | 11/2023 |
| CN | 103811591 A | 5/2014 |

(Continued)

OTHER PUBLICATIONS

WO 2013/125036 A1 online machine translation, as translacted by FIT database.*

(Continued)

*Primary Examiner* — Golam Mowla
(74) *Attorney, Agent, or Firm* — NIXON PEABODY LLP; Jeffrey L. Costellia

(57) ABSTRACT

A semiconductor substrate, including a back surface having N-type conductive regions and P-type conductive regions. The N-type conductive regions are provided with first non-pyramidal texture structures, and the P-type conductive regions are provided with second non-pyramidal texture structures. A top surface of the first non-pyramidal texture structure is a polygonal plane, and a top surface of the second non-pyramidal texture structure is a polygonal plane. A one-dimensional size of the top surface of the first non-pyramidal texture structure is less than a one-dimensional size of the top surface of the second non-pyramidal texture structure. The one-dimensional size of the top surface of the first non-pyramidal texture structure is in a range of 5 μm to 12 μm. The one-dimensional size of the top surface of the second non-pyramidal texture structure is in a range of 10 μm to 40 μm.

20 Claims, 6 Drawing Sheets

(51) Int. Cl.
*H01L 31/0352* (2006.01)
*H01L 31/0368* (2006.01)
*H01L 31/05* (2014.01)
*H01L 31/068* (2012.01)

(52) U.S. Cl.
CPC .... *H01L 31/03682* (2013.01); *H01L 31/0516* (2013.01); *H01L 31/0682* (2013.01)

(58) Field of Classification Search
CPC ........... H01L 31/03682; H01L 31/0516; H01L 31/0682; H01L 31/0747
See application file for complete search history.

(56) References Cited

U.S. PATENT DOCUMENTS

| | | |
|---|---|---|
| 2011/0100457 A1 | 5/2011 | Kim et al. |
| 2015/0380599 A1 | 12/2015 | Smith et al. |
| 2016/0380131 A1 | 12/2016 | Crafts et al. |
| 2017/0179325 A1 | 6/2017 | Chung et al. |
| 2019/0207040 A1 | 7/2019 | Harrington et al. |

FOREIGN PATENT DOCUMENTS

| | | | |
|---|---|---|---|
| CN | 205194713 U | | 4/2016 |
| CN | 108666376 | | 10/2018 |
| CN | 108831937 A | | 11/2018 |
| CN | 111108609 | | 5/2020 |
| CN | 112442739 A | | 3/2021 |
| CN | 212750903 U | | 3/2021 |
| CN | 113 224 202 | | 8/2021 |
| CN | 113540269 A | | 10/2021 |
| CN | 113594296 A | | 11/2021 |
| CN | 214797433 U | | 11/2021 |
| CN | 114267580 A | | 4/2022 |
| CN | 114335247 A | | 4/2022 |
| JP | 09-096595 | | 4/1997 |
| JP | 2002-224878 | | 8/2002 |
| JP | 2006-332273 A | | 12/2006 |
| JP | 2012243797 A | | 12/2012 |
| JP | 2013-110187 A | | 6/2013 |
| JP | 2014-086708 | | 5/2014 |
| JP | 2015185587 A | | 10/2015 |
| JP | 2016-225627 A | | 12/2016 |
| JP | 2019-149444 | | 9/2019 |
| JP | 2021197507 A | | 12/2021 |
| JP | 7082235 | | 6/2022 |
| WO | 2013101846 | | 7/2013 |
| WO | WO-2013/125036 A1 | | 8/2013 |
| WO | 2014196307 A1 | | 12/2014 |
| WO | 2016158226 A1 | | 10/2016 |

OTHER PUBLICATIONS

Japanese Office Action (Application No. 2022-113517) mailed Apr. 18, 2023 (14 pages).
Extended European Search Report (Application No. 22187232.8) mailed Dec. 19, 2022, (6pgs).
Australian Office Action for Application No. 2022206808, mailed Aug. 11, 2023 (16 pages).
Chinese Notice of Grant of Patent Right for Invention for App. No. 202210704732.3, mailed Jul. 31, 2023 (5 pages).
Japanese Office Action for Application No. 2022-113517, mailed Jul. 25, 2023 (12 pages).
Japanese Notice of Allowance in App. No. 2022-113517, dated Mar. 5, 2024 (4 pages).
Australian Office Action (Application No. 2024200716); mailed Nov. 7, 2024; pp. 11.

* cited by examiner

SEMICONDUCTOR SUBSTRATE, SOLAR CELL, AND PHOTOVOLTAIC MODULE

CROSS-REFERENCE TO RELATED APPLICATIONS

The present application claims priority to Chinese Application No. 202210704732.3, filed on Jun. 21, 2022, the content of which is incorporated herein by reference in its entirety.

TECHNICAL FIELD

The present disclosure relates to the technical field of photovoltaic cells and, in particular, to a semiconductor substrate, a solar cell, and a photovoltaic module.

BACKGROUND

An existing crystalline silicon solar cell adopts a double-sided contact metallization design. A textured light trapping structure is required on the front or back surface of the solar cell to increase transport paths of incident light in the solar cell, so as to improve the utilization of solar spectrums. However, an existing textured surface may adversely affect subsequent film passivation and slurry contact interfaces to a certain extent and thus affect performance of the solar cell.

SUMMARY

The present disclosure provides a semiconductor substrate, a solar cell, and a photovoltaic module, so as to solve the problem that surface texture structures of the existing solar cell may adversely affect subsequent film passivation and slurry contact interfaces to a certain extent and thus affect performance of the solar cell.

According to a first aspect of the present disclosure, the present disclosure provides a semiconductor substrate, including a back surface having N-type conductive regions and P-type conductive regions formed thereon. The N-type conductive regions are provided with first non-pyramidal texture structures, and the P-type conductive regions are provided with second non-pyramidal texture structures. A top surface of the first non-pyramidal texture structure is a polygonal plane and a top surface of the second non-pyramidal texture structure is a polygonal plane. A one-dimensional size of the top surface of the first non-pyramidal texture structure is less than a one-dimensional size of the top surface of the second non-pyramidal texture structure. The one-dimensional size of the top surface of the first non-pyramidal texture structure is greater than or equal to 5 μm and less than or equal to 12 μm. The one-dimensional size of the top surface of the second non-pyramidal texture structure is greater than or equal to 10 μm and less than or equal to 40 μm.

In one or more embodiments, the one-dimensional size of the top surface of the first non-pyramidal texture structure is greater than or equal to 7 μm and less than or equal to 10 μm.

In one or more embodiments, the one-dimensional size of the top surface of the second non-pyramidal texture structure is greater than or equal to 15 μm and less than or equal to 35 μm.

In one or more embodiments, the first non-pyramidal texture structure includes: two or more first substructures that are at least partially stacked on one another, and a one-dimensional size of a top surface of the outermost first substructure is greater than or equal to 5 μm and less than or equal to 12 μm, in a direction away from the back surface and perpendicular to the back surface; and two or more second substructures that are adjacent but not stacked on one another, and a one-dimensional size of a top surface of the second substructure away from the back surface is greater than or equal to 5 μm and less than or equal to 12 μm.

In one or more embodiments, the second non-pyramidal texture structure includes: two or more third substructures that are at least partially stacked on one another, and a one-dimensional size of a top surface of the outermost third substructure is greater than or equal to 10 μm and less than or equal to 40 μm, in a direction away from the back surface and perpendicular to the back surface; and two or more fourth substructures that are adjacent but not stacked on one another, and a one-dimensional size of a top surface of the fourth substructure away from the back surface is greater than or equal to 10 μm and less than or equal to 40 μm.

In one or more embodiments, a dividing line is provided between the N-type conductive region and the P-type conductive region, and the N-type conductive region and/or the P-type conductive region are provided with holes close to the dividing line.

In one or more embodiments, the N-type conductive region and/or the P-type conductive region are provided with the holes having a distance of 5 μm to 15 μm away from the dividing line.

In one or more embodiments, the N-type conductive region and/or the P-type conductive region are provided with the holes having a distance of 5 μm to 10 μm away from the dividing line.

In one or more embodiments, a diameter of the hole ranges from 1 μm to 10 μm.

In one or more embodiments, the diameter of the hole ranges from 1 μm to 5 μm.

In one or more embodiments, a depth of the hole ranges from 0.5 μm to 2 μm.

In one or more embodiments, a gap between two adjacent N-type conductive regions or between two adjacent P-type conductive regions ranges from 0.8 mm to 1.2 mm; the N-type conductive regions distributed on the back surface of the semiconductor substrate account for 50% to 85% of the back surface; and the P-type conductive regions distributed on the back surface of the semiconductor substrate account for 15% to 50% of the back surface.

In one or more embodiments, a shape of the polygonal plane includes at least one of a rhombus, a square, a trapezoid, an approximate rhombus, an approximate square, or an approximate trapezoid.

In one or more embodiments, the semiconductor substrate is a P-type crystalline silicon substrate.

According to a second aspect of the present disclosure, the present disclosure further provides a solar cell, including: a semiconductor substrate; a tunnel oxide layer; a local back surface field; a polysilicon film layer; an eutectic layer; a back-surface passivation layer; a first electrode; and a second electrode. The semiconductor includes a back surface having N-type conductive regions and P-type conductive regions formed thereon. The N-type conductive regions are provided with first non-pyramidal texture structures, and the P-type conductive regions are provided with second non-pyramidal texture structures. A top surface of the first non-pyramidal texture structure is a polygonal plane and a top surface of the second non-pyramidal texture structure is a polygonal plane. A one-dimensional size of the top surface of the first non-pyramidal texture structure is less than a one-dimensional size of the top surface of the second non-pyramidal texture structure. The one-dimensional size of the top surface of the first non-pyramidal texture structure is greater than or equal to 5 µm and less than or equal to 12 µm. The one-dimensional size of the top surface of the second non-pyramidal texture structure is greater than or equal to 10 µm and less than or equal to 40 µm. The tunnel oxide layer is formed over the N-type conductive region. The local back surface field is formed in the P-type conductive region. The polysilicon film layer is formed over a side of the tunnel oxide layer facing away from the semiconductor substrate. The eutectic layer is formed in the local back surface field. The back-surface passivation layer is formed over a side of the polysilicon film layer facing away from the tunnel oxide layer and over the P-type conductive region. The first electrode passes through the back-surface passivation layer to form ohmic contact with the local back surface field. The second electrode passes through the back-surface passivation layer to form ohmic contact with the polysilicon film layer.

According to a third aspect of the present disclosure, the present disclosure further provides a photovoltaic module, including a plurality of solar cells electrically connected into a solar cell string in a form of an entire cell or multiple-cut cells. At least one of the plurality of solar cells includes: a semiconductor substrate; a tunnel oxide layer; a local back surface field; a polysilicon film layer; an eutectic layer; a back-surface passivation layer; a first electrode; and a second electrode. The semiconductor includes a back surface having N-type conductive regions and P-type conductive regions formed thereon. The N-type conductive regions are provided with first non-pyramidal texture structures, and the P-type conductive regions are provided with second non-pyramidal texture structures. A top surface of the first non-pyramidal texture structure is a polygonal plane and a top surface of the second non-pyramidal texture structure is a polygonal plane. A one-dimensional size of the top surface of the first non-pyramidal texture structure is less than a one-dimensional size of the top surface of the second non-pyramidal texture structure. The one-dimensional size of the top surface of the first non-pyramidal texture structure is greater than or equal to 5 µm and less than or equal to 12 µm. The one-dimensional size of the top surface of the second non-pyramidal texture structure is greater than or equal to 10 µm and less than or equal to 40 µm. The tunnel oxide layer is formed over the N-type conductive region. The local back surface field is formed in the P-type conductive region. The polysilicon film layer is formed over a side of the tunnel oxide layer facing away from the semiconductor substrate. The eutectic layer is formed in the local back surface field. The back-surface passivation layer is formed over a side of the polysilicon film layer facing away from the tunnel oxide layer and over the P-type conductive region. The first electrode passes through the back-surface passivation layer to form ohmic contact with the local back surface field. The second electrode passes through the back-surface passivation layer to form ohmic contact with the polysilicon film layer.

It should be understood that the general description above and the detailed description in the following are merely illustrative, and shall not be construed as limitations to the present disclosure.

Figure 1:
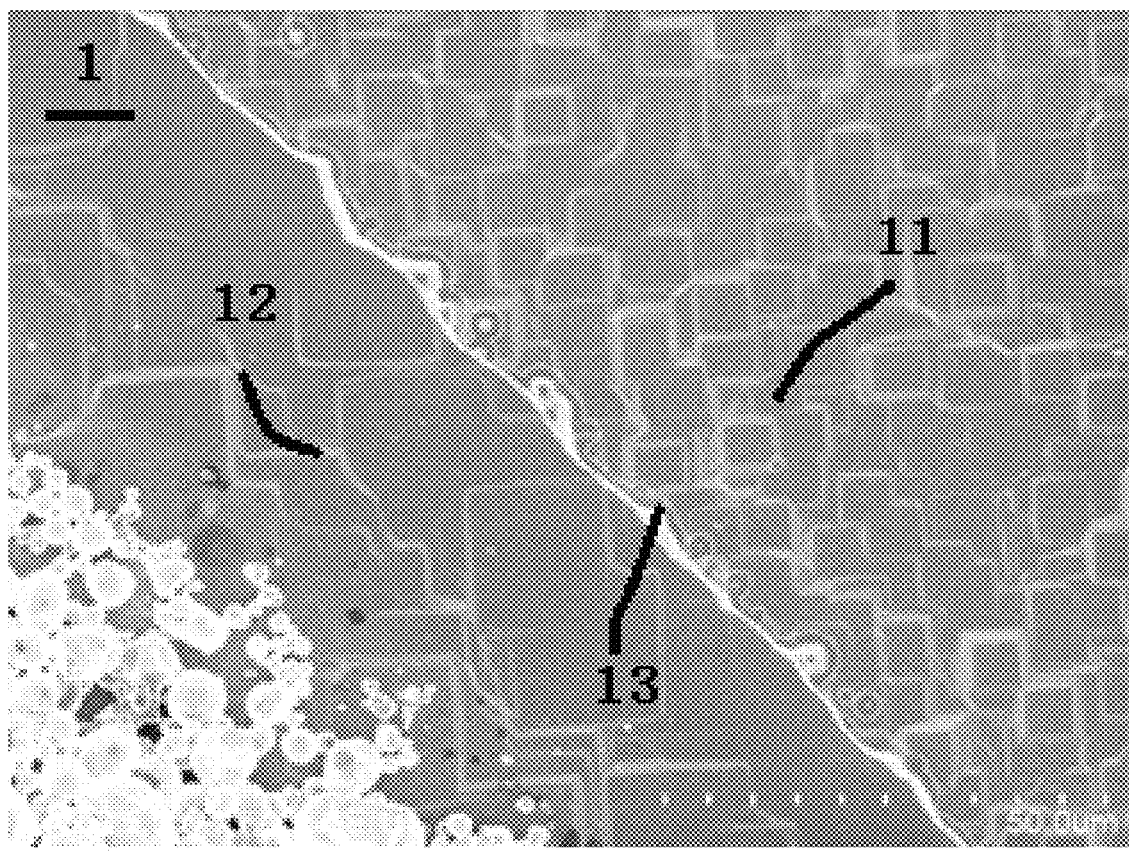
FIG. 1 is a scanning electron microscope (SEM) diagram of a semiconductor substrate at a magnification of 1 k according to one or more embodiments of the present disclosure.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

To facilitate a better understanding of the technical solutions of the present disclosure, embodiments of the present disclosure are described in detail below with reference to the accompanying drawings.

It should be made clear that the embodiments described are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are for the purpose of describing specific embodiments only, and are not intended to limit the present disclosure. As used in the embodiments and the appended claims of the present disclosure, the singular forms of "a/an", "the", and "said" are intended to include plural forms, unless otherwise clearly specified by the context.

It should be understood that the term "and/or" used herein is merely an association relationship describing associated objects, indicating that three relationships may exist. For example, A and/or B indicates that there are three cases of A alone, A and B together, and B alone. In addition, the character "I" herein generally means that associated objects before and after it are in an "or" relationship.

It should be noted that directional terms such as "above", "below", "left", "right" and the like described in the embodiments of the present disclosure are described with reference to the angles shown in the accompanying drawings, and should not be construed as limitations on the embodiments of the present disclosure. In addition, it should also be understood that, in the context, when one element is referred to as being formed "above" or "below" another element, it is possible that the one element is directly formed "above" or "below" another element, or the element is formed "above" or "below" another element via an intermediate element.

An Interdigitated Back Contact (IBC) solar cell is a back contact solar cell with electrodes all arranged on a back surface of a semiconductor substrate. Since a front surface of the semiconductor substrate is not shielded by electrodes, the entire area of the front surface can receive sunlight, which enables the IBC cell to have higher photoelectric conversion efficiency. Some texture structures are generally formed by polishing or partial texturing on the back surface of the semiconductor substrate of the IBC solar cell. The existing texture structure may adversely affects subsequent film passivation and slurry contact interfaces to a certain extent and thus affect the photoelectric conversion efficiency of the IBC cell.

Figure 2:
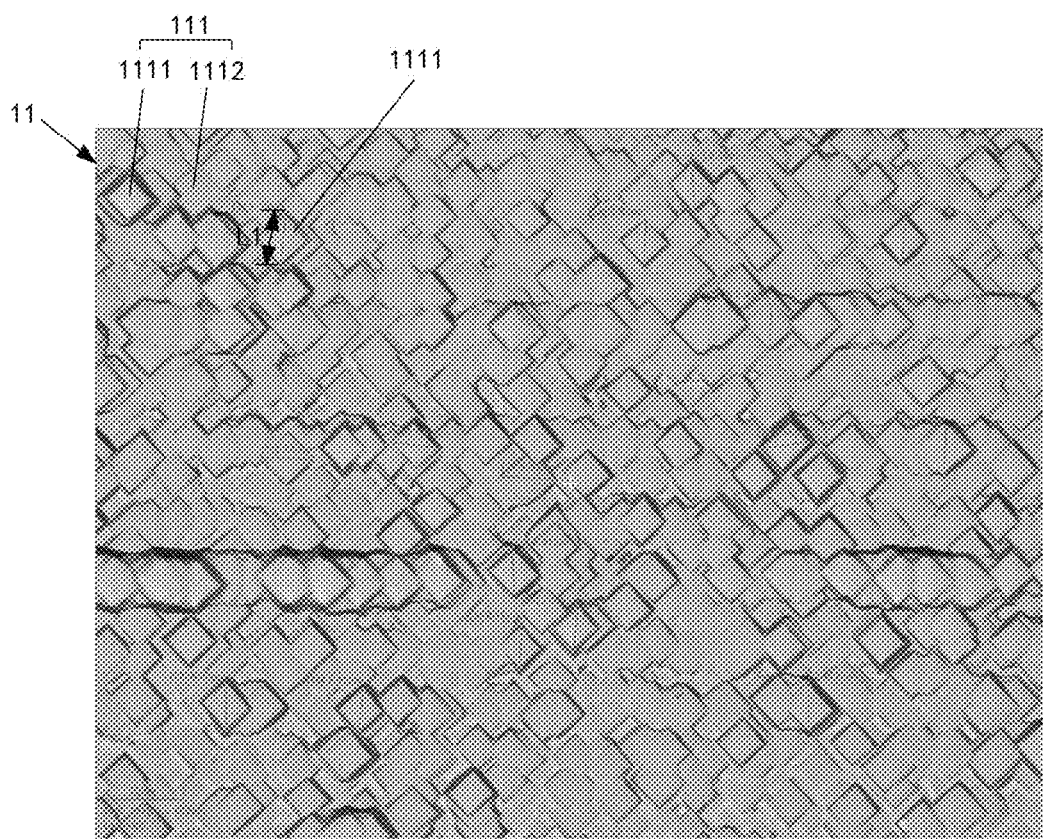
FIG. 2 is a microscopic view of first non-pyramidal texture structures on N-type conductive regions of a semiconductor substrate at a first angle according to one or more embodiments of the present disclosure.
Figure 3:
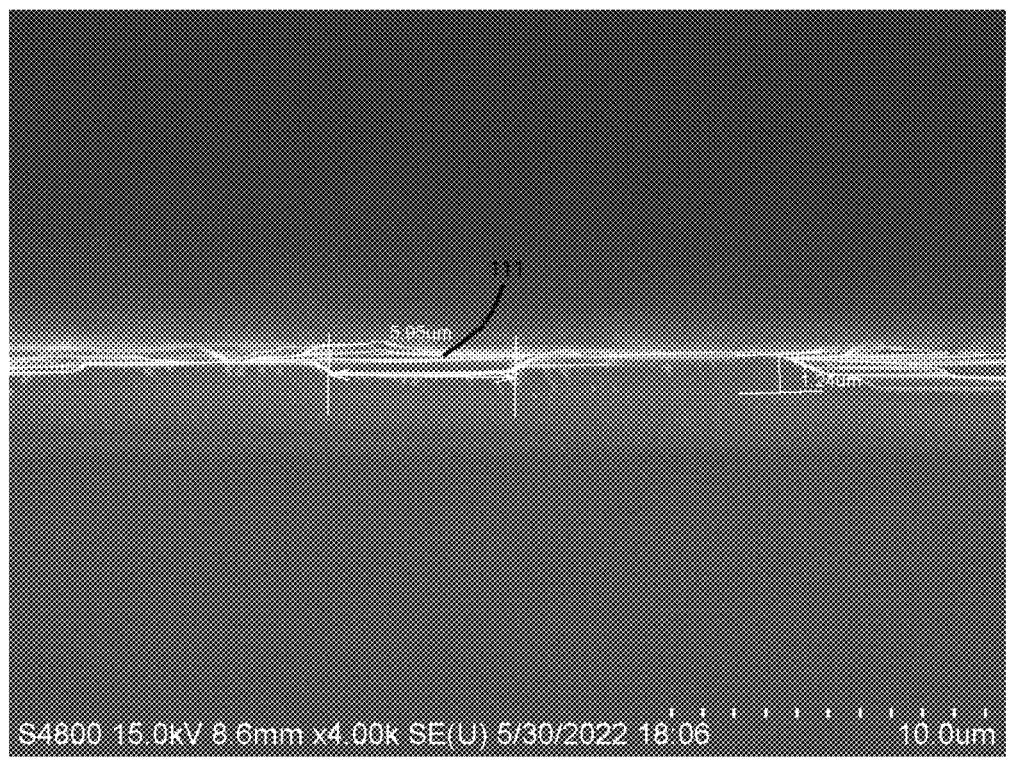
FIG. 3 is an SEM diagram of first non-pyramidal texture structures on N-type conductive regions of a semiconductor substrate at a second angle according to one or more embodiments of the present disclosure.
Figure 4:
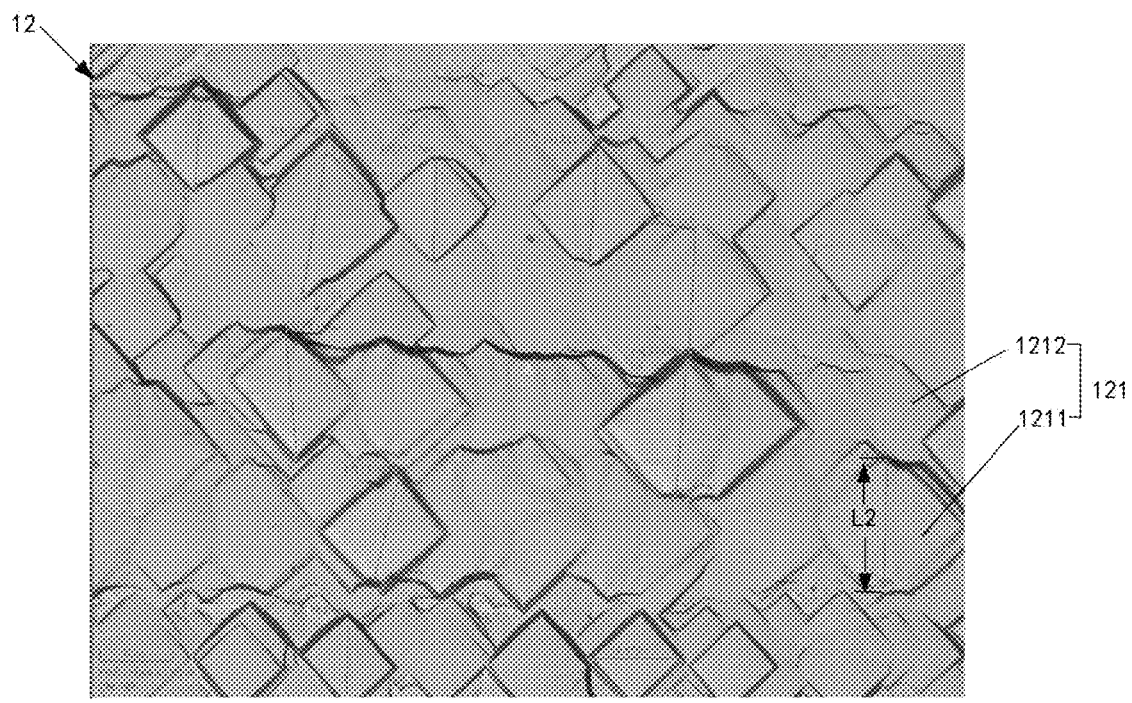
FIG. 4 is a microscopic view of second non-pyramidal texture structures on P-type conductive regions of a semiconductor substrate at a first angle according to one or more embodiments of the present disclosure.
Figure 5:
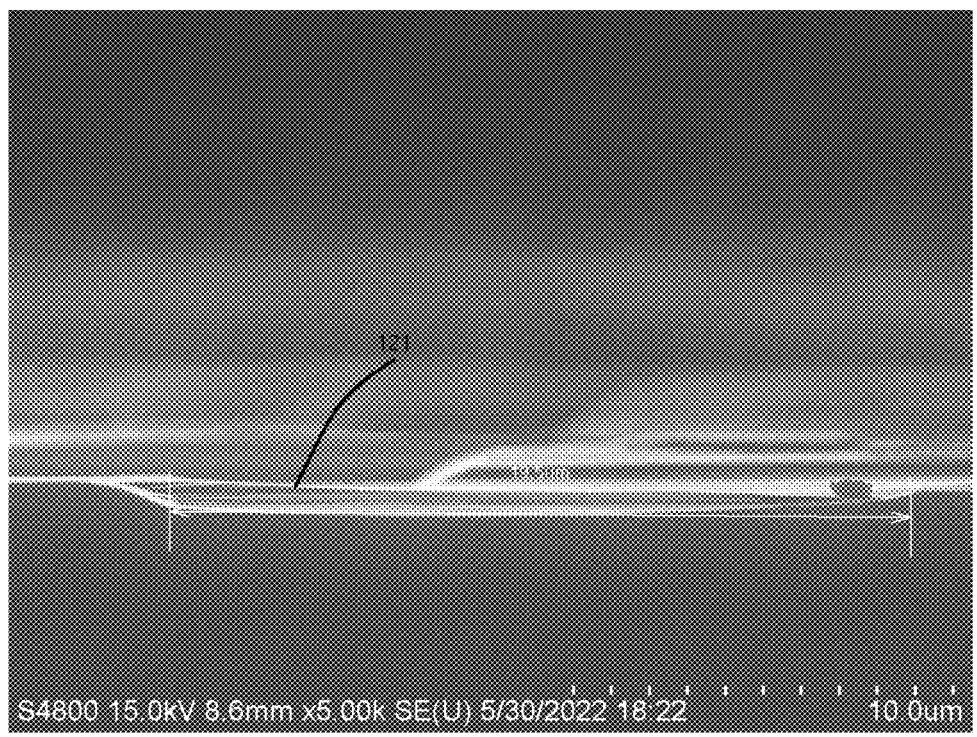
FIG. 5 is an SEM diagram of second non-pyramidal texture structures on P-type conductive regions of a semiconductor substrate at a second angle according to one or more embodiments of the present disclosure.

Based on the above, as shown in FIG. 1, the present disclosure provides a semiconductor substrate 1. The semiconductor substrate 1 has N-type conductive regions 11 and P-type conductive regions 12 on a back surface. As shown in FIG. 2 and FIG. 3, the N-type conductive regions 11 are provided with first non-pyramidal texture structures 111. As shown in FIG. 4 and FIG. 5, the P-type conductive regions 12 are provided with second non-pyramidal texture structures 121.

Top surfaces of the first non-pyramidal texture structures 111 and top surfaces of the second non-pyramidal texture structures 121 are polygonal planes, and a one-dimensional size L1 of the top surface of the first non-pyramidal texture structure 111 is substantially less than a one-dimensional size L2 of the top surface of the second non-pyramidal texture structure 121.

The one-dimensional size L1 of the top surface of the first non-pyramidal texture structure 111 is greater than or equal to 5 μm and less than or equal to 12 μm. The one-dimensional size L2 of the top surface of the second non-pyramidal texture structure 121 is greater than or equal to 10 μm and less than or equal to 40 μm.

It is to be noted that the semiconductor substrate 1 generally has a front surface and a back surface. The front surface of the semiconductor substrate 1 may refer to a light receiving surface, that is, a surface receiving sunlight (light receiving surface). The back surface of the semiconductor substrate 1 refers to a surface opposite to the front surface. A non-pyramid shape may be understood as a tower/quadrangular frustum pyramid or stepped shape resulting from destruction of a spire of a pyramidal microstructure. The non-pyramidal texture structures may be formed by a process such as chemical etching, laser etching, mechanical etching or plasma etching of the semiconductor substrate 1. The one-dimensional size of the top surface of the non-pyramidal texture structure may be, for example, surface length, width, diagonal length, circular diameter, or the like, which is not limited herein. In some examples, when the one-dimensional size of the top surface of the non-pyramidal texture structure is measured, film surfaces may be directly measured by a testing instrument (an optical microscope, an atomic force microscope, a scanning electron microscope, a transmission electron microscope, or the like) for calibration.

In some embodiments, the semiconductor substrate 1 may be one of a monocrystalline silicon substrate, a polycrystalline silicon substrate, a microcrystalline silicon substrate, and a silicon carbide substrate. In some embodiments, the semiconductor substrate is a P-type crystalline silicon substrate. The one-dimensional size of the top surface of the first non-pyramidal texture structure 111 may be 5 μm, 6 μm, 7 μm, 8 μm, 9 μm, 10 μm, 11 μm, 12 μm, or the like, and may also be other values in the range, which is not limited herein. The polygonal planes are in the shape of at least one of a rhombus, a square, a trapezoid, an approximate rhombus, an approximate square, or an approximate trapezoid. The one-dimensional size of the top surface of the second non-pyramidal texture structure 121 may be 10 μm, 15 μm, 20 μm, 25 μm, 30 μm, 35 μm, 40 μm, or the like, and may also be other values in the range, which is not limited herein.

It may be understood that the semiconductor substrate of the present disclosure has N-type conductive regions 11 and P-type conductive regions 12 on a back surface, which are respectively used for N-type conductivity type doping and P-type conductivity type doping during the manufacturing process of the solar cell. In the present disclosure, the N-type conductive regions 11 are provided with first non-pyramidal texture structures 111, and the P-type conductive regions 12 are provided with second non-pyramidal texture structures 121. Compared with pyramidal texture structures, during the manufacturing process of the solar cell, the non-pyramidal texture structures facilitate subsequent formation of films on the semiconductor substrate 1, so that higher quality of passivation can be achieved. The non-pyramidal texture structures have better characteristics of contact with slurry, so as to be better filled with screen printing metal slurry during the formation of electrodes, thereby achieving more excellent electrode contact, obtaining a higher open-circuit voltage and a larger fill factor, and thus achieving higher solar cell conversion efficiency.

In the present disclosure, it is defined that top surfaces of the first non-pyramidal texture structures 111 and top surfaces of the second non-pyramidal texture structures 121 are polygonal planes, and one-dimensional sizes of the top surfaces of the first non-pyramidal texture structures 111 are less than one-dimensional sizes of the top surfaces of the second non-pyramidal texture structures 121. Moreover, a range of the one-dimensional sizes of the top surfaces of the first non-pyramidal texture structures 111 and a range of the one-dimensional sizes of the top surfaces of the second non-pyramidal texture structures 121 are further defined. In the present disclosure, non-pyramidal texture structures of different sizes are correspondingly designed for doping characteristics of N-type conductivity type doping and P-type conductivity type doping, so that the quality of passivation of the corresponding regions and characteristics of contact with the slurry can be improved in a more targeted manner, thereby enabling the manufactured solar cell to achieve higher solar cell conversion efficiency.

In some embodiments, the one-dimensional size of the top surface of the first non-pyramidal texture structure 111 is greater than or equal to 7 μm and less than or equal to 10 μm.

It may be understood that, by further defining the one-dimensional size of the top surface of the first non-pyramidal texture structure 111, during the manufacturing process of the solar cell, the N-type conductive regions 11 can achieve higher quality of passivation and better characteristics of contact with the slurry, thereby obtaining a higher open-circuit voltage and a larger fill factor and thus achieving higher solar cell conversion efficiency.

In some embodiments, the one-dimensional size of the top surface of the second non-pyramidal texture structure 121 is greater than or equal to 15 μm and less than or equal to 35 μm.

It may be understood that, by further defining the one-dimensional sizes of the top surfaces of the second non-pyramidal texture structures 121, during the manufacturing process of the solar cell, the P-type conductive regions 12 can achieve higher quality of passivation and better characteristics of contact with the slurry, thereby obtaining a higher open-circuit voltage and a larger fill factor and thus achieving higher solar cell conversion efficiency.

In some embodiments, as shown in FIG. 2, the first non-pyramidal texture structures 111 each include: two or more first substructures 1111 that are at least partially stacked, and two or more second substructures 1112 that are adjacent but not stacked. For the two or more first substructures 1111 that are at least partially stacked, a one-dimensional size L11 of a top surface of the outermost first substructure 1111 is greater than or equal to 5 μm and less than or equal to 12 μm in a direction away from the back surface and perpendicular to the back surface. A one-dimensional size L12 of a top surface of the second substructure 1112 away from the back surface is greater than or equal to 5 μm and less than or equal to 12 μm.

It is to be noted that the direction away from the back surface and perpendicular to the back surface may also be understood as a stack direction.

It may be understood that the first non-pyramidal texture structures 111 of the present disclosure each include two or more first substructures 1111 that are at least partially stacked and two or more second substructures 1112 that are adjacent but not stacked, so that roughness of the first non-pyramidal texture structures 111 can be controlled within the required range, which is conducive to the solar cell in a screen printing section, thereby enhancing contact of the slurry at the N-type conductive regions 11, improving tension of the slurry, improving the quality and yield of the solar cell, increasing an open-circuit voltage of the solar cell, improving the fill factor, and thus increasing the photoelectric conversion efficiency.

In some embodiments, as shown in FIG. 4, the second non-pyramidal texture structures 121 each include: two or more third substructures 1211 that are at least partially stacked, and two or more fourth substructures 1212 that are adjacent but not stacked. For the two or more third substructures 1211 that are at least partially stacked, a one-dimensional size of a top surface of the outermost third substructure 1211 is greater than or equal to 10 μm and less than or equal to 40 μm in a direction away from the back surface and perpendicular to the back surface. A one-dimensional size of a top surface of the fourth substructure 1212 away from the back surface is greater than or equal to 10 μm and less than or equal to 40 μm.

It may be understood that the second non-pyramidal texture structures 121 of the present disclosure each include two or more third substructures 1211 that are at least partially stacked and two or more fourth substructures 1212 that are adjacent but not stacked, so that roughness of the second non-pyramidal texture structures 121 can be controlled within the required range, which is conducive to the solar cell in a screen printing section, thereby enhancing contact of the slurry at the P-type conductive regions 12, improving tension of the slurry, improving the quality and yield of the solar cell, increasing an open-circuit voltage of the solar cell, improving the fill factor, and thus increasing the photoelectric conversion efficiency.

Figure 6:
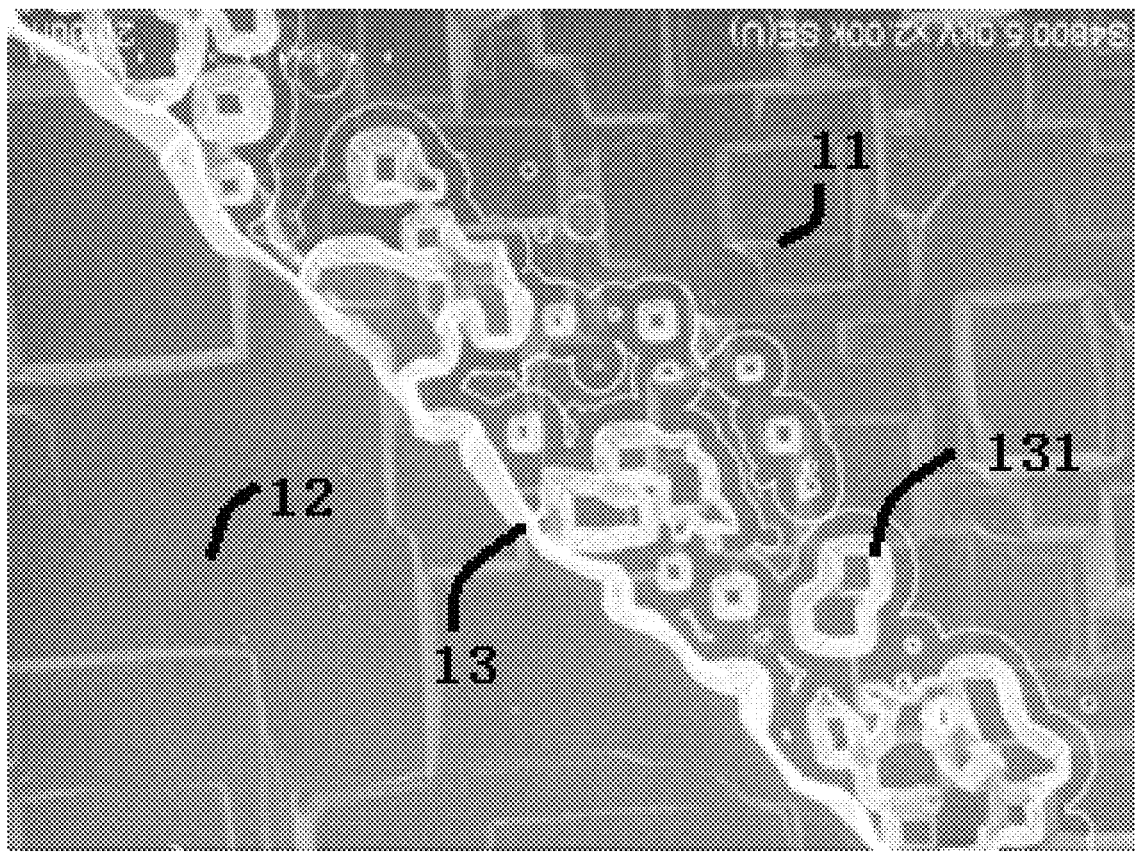
FIG. 6 is an SEM diagram of a semiconductor substrate at a magnification of 2 k according to one or more embodiments of the present disclosure.
Figure 7:
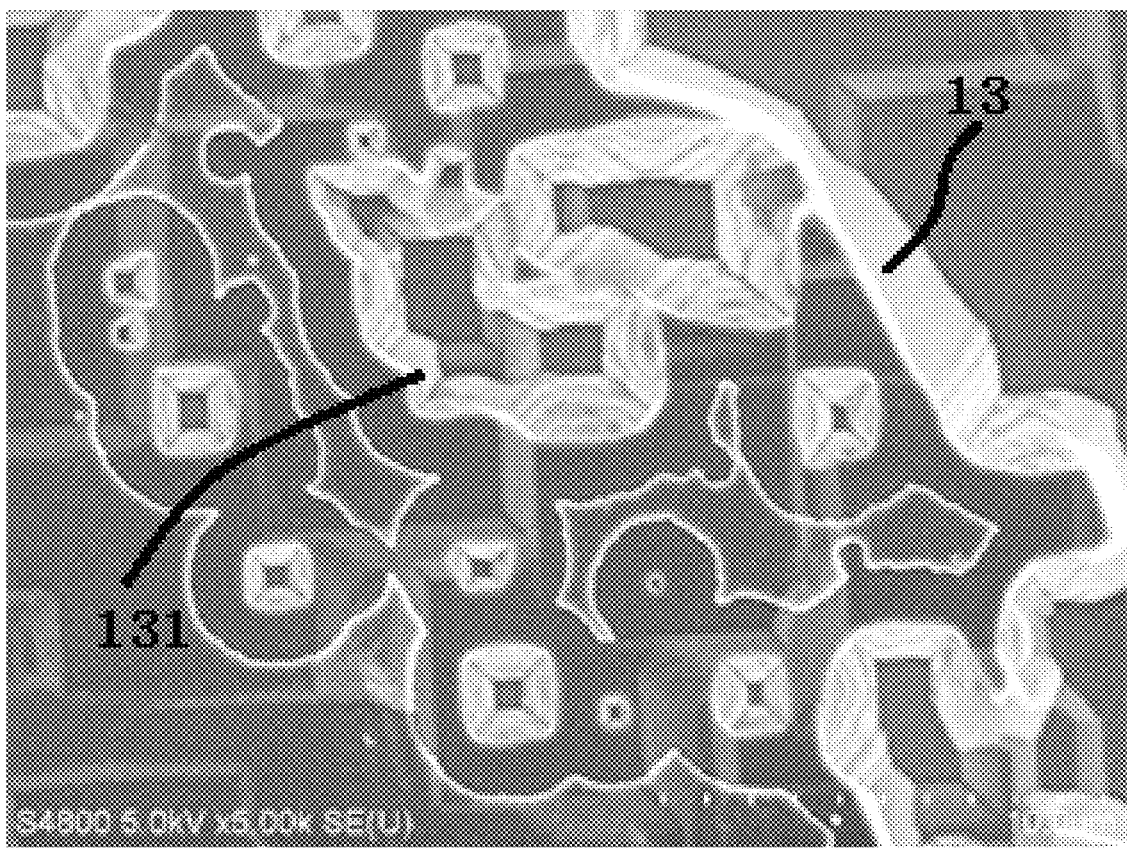
FIG. 7 is an SEM diagram of a semiconductor substrate at a magnification of 5 k according to one or more embodiments of the present disclosure.
Figure 8:
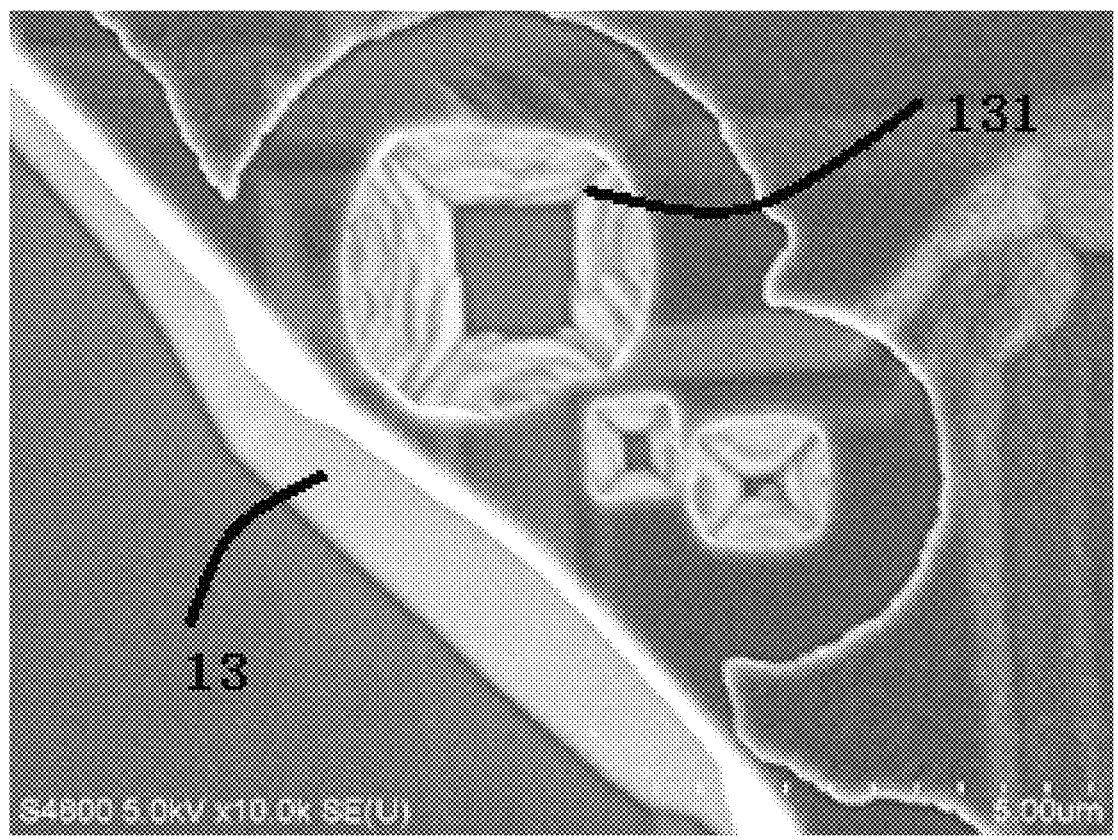
FIG. 8 is an SEM diagram of a semiconductor substrate at a magnification of 10 k according to one or more embodiments of the present disclosure.

In some embodiments, as shown in FIG. 6, a dividing line 13 exists between the N-type conductive region 11 and the P-type conductive region 12. As shown in FIG. 6 to FIG. 8, the N-type conductive regions 11 and/or the P-type conductive regions 12 are provided with holes 131 near the dividing line 13.

It may be understood that the holes 131 of the N-type conductive regions 11 and/or the P-type conductive regions 12 arranged near the dividing line 13 are conducive to transport of carriers, and thus contribute to the improvement of performance of the solar cell. In addition, reflectivity of a band of 900 to 1200 can be increased by 1% to 10%.

In some embodiments, during the manufacturing process of the solar cell, when excess films of the P-type conductive regions 12 are removed by laser, the laser may cause thermal damages to the adjacent N-type conductive regions 11 and damage surface films thereof, and thermally damaged regions are etched in a subsequent alkaline polishing process to form the holes 131.

In some embodiments, the N-type conductive regions and/or the P-type conductive regions are provided with the holes 131 that are 5 μm to 15 μm away from the dividing line 13.

In some embodiments, the holes 131 may be arranged 5 μm, 6 μm, 7 μm, 8 μm, 9 μm, 10 μm, 11 μm, 12 μm, 13 μm, 14 μm, 15 μm or the like away, may also be other values in the range, which is not limited herein.

In some embodiments, the N-type conductive regions 11 and/or the P-type conductive regions 12 are provided with the holes 131 that are 5 μm to 10 μm away from the dividing line 13.

In some embodiments, a diameter of the hole 131 ranges from 1 μm to 10 μm.

In some embodiments, the diameter of the hole 131 may be 1 μm, 2 μm, 3 μm, 4 μm, 5 μm, 6 μm, 7 μm, 8 μm, 9 μm, 10 μm or the like, may also be other values in the range, which is not limited herein.

In some embodiments, the diameter of the hole 131 ranges from 1 μm to 5 μm.

In some embodiments, a depth of the hole 131 ranges from 0.5 μm to 2 μm.

In some embodiments, the depth of the hole 131 may be 0.5 μm, 0.6 μm, 0.7 μm, 0.8 μm, 0.9 μm, 1 μm, 1.1 μm, 1.2 μm, 1.3 μm, 1.4 μm, 1.5 μm, 1.6 μm, 1.7 μm, 1.8 μm, 1.9 μm, 2 μm or the like, may also be other values in the range, which is not limited herein. Here, the depth of the hole 131 may be obtained by scanning under a 3D microscope. In some embodiments, the depth of the hole 131 may be ½ to ⅓ of an alkali etching depth (based on polished surface etching).

In some embodiments, a gap between two adjacent N-type conductive regions 11 or between two adjacent P-type conductive regions 12 ranges from 0.8 mm to 1.2 mm. The N-type conductive regions 11 distributed on the back surface of the semiconductor substrate 1 account for 50% to 85%. The P-type conductive regions 12 distributed on the back surface of the semiconductor substrate 1 account for 15% to 50%.

In some embodiments, the gap between two adjacent N-type conductive regions 11 or between two adjacent P-type conductive regions 12 may be 0.8 mm, 0.85 mm, 0.9 mm, 0.95 mm, 1.0 mm, 1.05 mm, 1.1 mm, 1.15 mm, 1.2 mm or the like, may also be other values in the range, which is not limited herein. The N-type conductive regions 11 distributed on the back surface of the semiconductor substrate 1 may account for 50%, 55%, 60%, 65%, 70%, 75%, 80%, 85% or the like, may also be other values in the range, which is not limited herein. Accordingly, the P-type conductive regions 12 distributed on the back surface of the semiconductor substrate 1 may account for 50%, 45%, 40%, 35%, 30%, 25%, 20%, 15% or the like, may also be other values in the range, which is not limited herein.

It may be understood that, by defining the gap between two adjacent N-type conductive regions 11 or between two adjacent P-type conductive regions 12 on the semiconductor substrate 1 and the proportions of the N-type conductive regions 11 and the P-type conductive regions 12 distributed on the back surface of the semiconductor substrate 1, PN junctions with excellent conductivity can be formed on the semiconductor substrate 1, thereby improving photoelectric performance of the manufactured solar cell.

In some embodiments, the manufacturing of the semiconductor substrate 1 according to the present disclosure includes first using alkali polishing to manufacture a back structure with morphology of a small tower base to deposit corresponding films as the N-type conductive regions, determining the P-type conductive regions by laser ablation, and using alkali polishing again to remove laser damages to form plane surface morphology of a large tower base. When excess films of the P-type conductive regions are removed by laser, the laser causes thermal damages to the adjacent N-type conductive regions and damages surface films thereof, and thermally damaged regions are etched in a subsequent alkaline polishing process to form the holes. During the manufacturing process, the laser process can be adjusted to control the thermal damages within a certain range of the junction.

It is to be noted that the semiconductor substrate 1 of the present disclosure can be formed during the manufacturing process of the solar cell or formed during the manufacturing process of an original substrate (silicon wafer) prior to the manufacturing of the solar cell.

Figure 9:
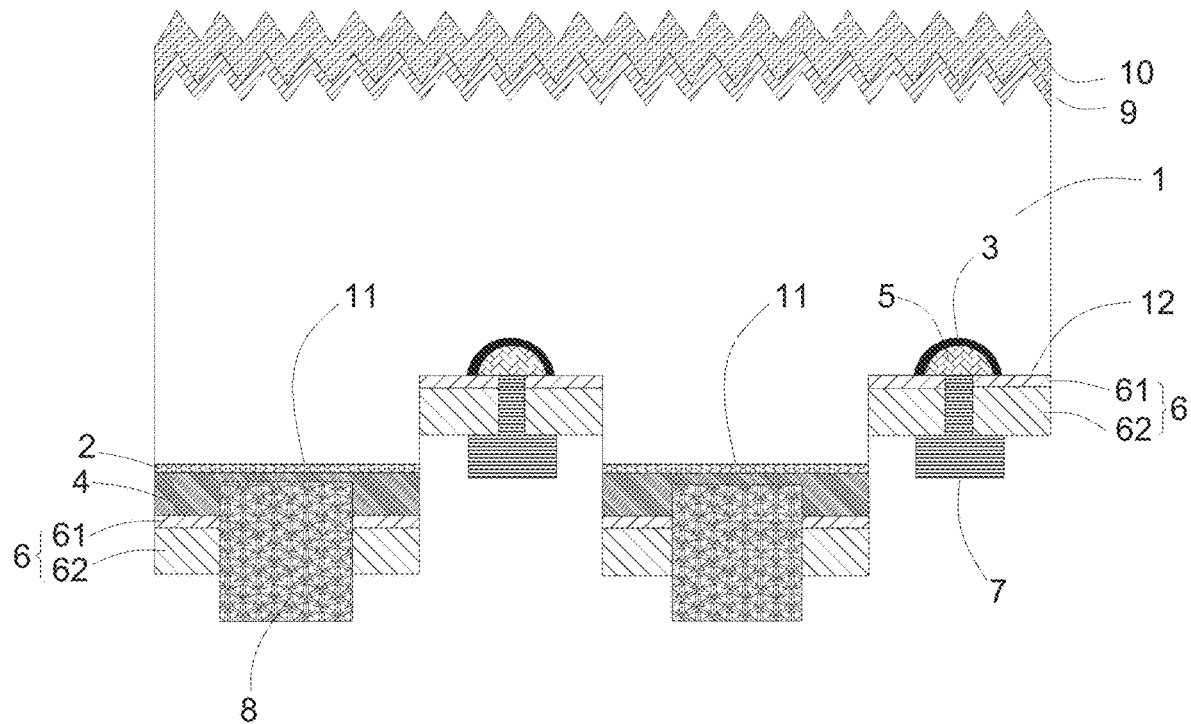
FIG. 9 is a schematic structural diagram of a solar cell according to one or more embodiments of the present disclosure.

In a second aspect, the present disclosure further provides a solar cell. As shown in FIG. 9, the solar cell includes the semiconductor substrate 1 described above in the present disclosure, tunnel oxide layer(s) 2, local back surface field(s) 3, polysilicon film layer(s) 4, eutectic layer(s) 5, back-surface passivation layer(s) 6, first electrode(s) 7, and second electrode(s) 8.

The semiconductor substrate 1 may be one of a monocrystalline silicon substrate, a polycrystalline silicon substrate, a microcrystalline silicon substrate, or a silicon carbide substrate. In some embodiments, the semiconductor substrate is a P-type crystalline silicon substrate.

The tunnel oxide layer 2 is arranged in the N-type conductive region 11 on the back surface of the semiconductor substrate 1. The tunnel oxide layer 2 may be a stack structure of one or more of silicon oxide layers, aluminum oxide layers, silicon oxynitride layers, molybdenum oxide layers, and hafnium oxide layers. In other embodiments, the tunnel oxide layer 2 may also be an oxygen-containing silicon nitride layer, an oxygen-containing silicon carbide layer, or the like. In some embodiments, the N-type conductive regions 11 on the back surface of the semiconductor substrate 1 may be etched by ozone oxidation, high-temperature thermal oxidation, nitric acid oxidation, chemical vapor deposition, or low-pressure chemical vapor deposition and then treated to form the tunnel oxide layer 2.

The local back surface field 3 is arranged in the P-type conductive regions 12 on the back surface of the semiconductor substrate 1. The formation of the local back surface field 3 in the P-type conductive regions 12 can increase the open-circuit voltage of the manufactured solar cell, reduce aluminum-silicon lap resistance Rs, and thus effectively improve the photoelectric conversion efficiency of the solar cell. In some embodiments, the local back surface field 3 is an aluminum back surface field.

The polysilicon film layer 4 is arranged on a side of the tunnel oxide layer 2 deviating from the semiconductor substrate 1. The polysilicon film have electrical characteristics of crystalline silicon, as well as advantages of low costs, simple equipment, and large-area manufacturing of amorphous silicon films. The polysilicon film may be deposited on a surface of the tunnel oxide layer 2 by any one of physical vapor deposition, chemical vapor deposition, plasma enhanced chemical vapor deposition, and atomic layer deposition to form the polysilicon film layer 4.

The eutectic layer 5 is arranged in the local back surface field 3. In some embodiments, the eutectic layer 5 is a silicon-aluminum eutectic layer.

The back-surface passivation layer 6 is formed on a side of the polysilicon film layer 4 deviating from the tunnel oxide layer 2 and in the P-type conductive region 12. The back-surface passivation layer 6 performs passivation on the back surface of the semiconductor substrate 1. The back-surface passivation layer 6 may be composed of one or more passivation layers. The back-surface passivation layer 6 may include passivation layers such as aluminum oxide, silicon nitride, silicon oxide, silicon oxynitride, and silicon oxycarbonitride layers. In some embodiments, the back-surface passivation layer 6 includes a first back-surface passivation layer 61 and a second back-surface passivation layer 62. The first back-surface passivation layer 61 and the second back-surface passivation layer 62 are sequentially arranged along a direction deviating from the back surface of the semiconductor substrate 1. In some embodiments, the first back-surface passivation layer 61 may be an aluminum oxide layer, and the second back-surface passivation layer 62 may be a silicon nitride layer.

The first electrode 7 passes through the back-surface passivation layer 6 to form ohmic contact with the local back surface field 3.

The second electrode 8 sequentially passes through the back-surface passivation layer 6 to form ohmic contact with the polysilicon film layer 4. The first electrode 7 and the second electrode 8 may be formed by sintering metal conductive slurry applied to the back-surface passivation layer 6. In some embodiments, a material of the first electrode 7 and/or the second electrode 8 include metal material such as silver, aluminum, copper, and nickel. For example, the first electrode 7 includes an aluminum material, and the second electrode includes a silver material.

In some embodiments, as shown in FIG. 9, the solar cell further includes: a front-surface passivation layer 9 and an antireflection layer 10 formed on the front surface of the semiconductor substrate 1 and sequentially stacked in a direction away from the semiconductor substrate 1. The front-surface passivation layer 9 performs passivation on the front surface of the semiconductor substrate 1. The front-surface passivation layer 9 may be composed of one or more passivation layers. The front-surface passivation layer 9 may include passivation layers such as aluminum oxide, silicon nitride, silicon oxide, silicon oxynitride, and silicon oxycarbonitride layers. In some embodiments, the front-surface passivation layer 9 may be aluminum oxide layers. The antireflection layer 10 can prevent and reduce reflection of light, so as to achieve full utilization of solar energy. The antireflection layer 10 may be formed on the front-surface passivation layer 9 by chemical vapor deposition, physical vapor deposition, or high-temperature nitridation. In some embodiments, the antireflection layer 10 may be a silicon oxynitride layer.

In a third aspect, the present disclosure further provides a photovoltaic module. The photovoltaic module includes the solar cells described above, and solar cell conversion efficiency of the photovoltaic module can be improved. The photovoltaic module includes the solar cells. The solar cells are electrically connected to form a plurality of solar cell strings in the form of an entire cell or multiple-cut cells (such as a ½ equal cut, a ⅓ equal cut, and a ¼ equal cut). The plurality of solar cell strings are electrically connected in series and/or in parallel. In some embodiments, the photovoltaic module further includes an encapsulation layer and a cover plate. The encapsulation layer is configured to seal the plurality of solar cell strings, and the cover plate covers the encapsulation layer. For example, the encapsulation layer may be made of an organic material, for example, ethylene vinyl acetate (EVA), polyolefin elastomer (POE) or polyethylene terephthalate (PET), and the cover plate may be a cover plate with a light transmission function, for example, a glass cover plate or a plastic cover plate.

In a fourth aspect, the present disclosure further provides a method for manufacturing a solar cell. The method includes the following steps.

In step S1, a semiconductor substrate 1 is provided, and the semiconductor substrate 1 is sequentially textured and oxidized.

In step S2, a front-surface passivation layer 9 and an antireflection layer 10 are sequentially stacked on a front surface of the semiconductor substrate 1 and in a direction away from the semiconductor substrate 1.

In step S3, after acid pickling of a back surface of the semiconductor substrate 1, the back surface of the semiconductor substrate 1 is polished with an alkali solution, so that first non-pyramidal texture structures 111 are formed on the back surface of the semiconductor substrate 1.

In step S4, a tunnel oxide layer 2 is formed on the first non-pyramidal texture structures 111 on the back surface of the semiconductor substrate 1; and a polysilicon film layer 4 is deposited on a surface of the tunnel oxide layer 2. In some embodiments, the polysilicon film layer 4 may be doped to form a doped conductive layer.

In step S5, P-type conductive regions 12 are determined and formed by laser ablation, and regions where the first non-pyramidal texture structures 111 are formed are taken as N-type conductive regions 11; the P-type conductive regions 12 on the back surface of the semiconductor substrate 1 are polished with an alkali solution, so that second non-pyramidal texture structures 121 are formed in the P-type conductive regions 12 on the back surface of the semiconductor substrate 1. Top surfaces of the first non-pyramidal texture structures 111 and top surfaces of the second non-pyramidal texture structures 121 are polygonal planes, and a one-dimensional size L1 of the top surface of the first non-pyramidal texture structure 111 is less than a one-dimensional size L2 of the top surface of the second non-pyramidal texture structure 121. The one-dimensional size L1 of the top surface of the first non-pyramidal texture structure 111 is greater than or equal to 5 µm and less than or equal to 12 The one-dimensional size L2 of the top surface of the second non-pyramidal texture structure 121 is greater than or equal to 10 µm and less than or equal to 40 In some embodiments, conditions of the laser ablation include: a laser type of ultraviolet laser with a wavelength of 355 nm or green laser with a wavelength of 556 nm, and a spot size in a range of 30 µm to 100 µm. In some embodiments, when excess films of the P-type conductive regions 12 are removed by laser, the laser may cause thermal damages to the adjacent N-type conductive regions 11 and damage surface films thereof, and thermally damaged regions are etched in a subsequent alkaline polishing process to form the holes 131. During the manufacturing process, thermal loss can be controlled within a certain range by adjusting parameters of laser ablation.

In step S6, the P-type conductive region 12 on the back surface of the semiconductor substrate 1 is patterned to form local back surface field 3 and eutectic layer 5.

In step S7, a back-surface passivation layer 6 is deposited on a surface of the polysilicon film layer 4 and in the P-type conductive region 12. In some embodiments, the back-surface passivation layer 6 includes a first back-surface passivation layer 61 and a second back-surface passivation layer 62. During the manufacturing process, the first back-surface passivation layers 61 are deposited on the a surface of the polysilicon film layer 4 and in the P-type conductive region 12, and then the second back-surface passivation layers 62 are deposited.

Comparative Example

In a comparative example, a solar cell is provided. The solar cell includes a semiconductor substrate. The semiconductor substrate has N-type conductive regions and P-type conductive regions formed over a back surface. The N-type conductive regions and the P-type conductive regions have the same non-pyramidal texture structures.

Compared with the structure of the solar cell in the comparative example, the N-type conductive regions and the P-type conductive regions on the back surface of the solar cell according to the present disclosure are provided with first non-pyramidal texture structures and second non-pyramidal texture structures with different sizes, respectively, and other structures and manufacturing methods are all the same.

TABLE 1

Table of comparison between performance of the solar cell according to the present disclosure and the solar cell according to the comparative example

| Group | Conversion efficiency Eta/100% | Open-circuit voltage Voc/mV | Short-circuit current Isc/A | Fill factor FF/% |
|---|---|---|---|---|
| Solar cell according to the present disclosure | 24.35 | 705.0 | 11.25 | 82.1 |
| Solar cell according to a comparative example | 24.18 | 704.6 | 11.22 | 81.8 |
| Difference | 0.17 | 0.4 | 0.03 | 0.3 |

The conversion efficiency of the solar cell=(open-circuit voltage*short-circuit current*fill factor)/(solar cell area*light amplitude)10*100%. As can be seen, the open-circuit voltage, the short-circuit current, and the fill factor are proportional to the conversion efficiency. As can be seen from data in Table 1, the conversion efficiency of the solar cell provided with non-pyramidal texture structures of different sizes on the semiconductor substrate 1 is 0.17% higher than the solar cell provided with non-pyramidal texture structures of a same size on the semiconductor substrate 1.

The above are only preferred embodiments of the present disclosure and are not intended to limit the present disclosure. For those skilled in the art, the present disclosure may have various modifications and variations. Any modifications, equivalent substitutions, improvements and the like made should fall within the protection scope of the present disclosure.

What is claimed is:

1. A semiconductor substrate, comprising:
 a back surface including N-type conductive regions and P-type conductive regions formed thereon,
 wherein the N-type conductive regions are provided with first non-pyramidal texture structures, and the P-type conductive regions are provided with second non-pyramidal texture structures; and each of the first non-pyramidal texture structures and the second non-pyramidal texture structures is formed as a shape resulting from destruction of a spire of a pyramidal microstructure that protrudes towards a direction away from the back surface of the semiconductor substrate;
 a top surface of the first non-pyramidal texture structure is a polygonal plane and a top surface of the second non-pyramidal texture structure is a polygonal plane, and a one-dimensional size of the top surface of the first non-pyramidal texture structure in a dimension is less than a one-dimensional size of the top surface of the second non-pyramidal texture structure in the same dimension, the one-dimensional size being a length, a width, a diagonal length, or a circular diameter of the top surface; and
 the one-dimensional size of the top surface of the first non-pyramidal texture structure is greater than or equal to 5 μm and less than or equal to 12 μm; and the one-dimensional size of the top surface of the second non-pyramidal texture structure is greater than or equal to 10 μm and less than or equal to 40 μm.

2. The semiconductor substrate according to claim 1, wherein the one-dimensional size of the top surface of the first non-pyramidal texture structure is greater than or equal to 7 μm and less than or equal to 10 μm.

3. The semiconductor substrate according to claim 1, wherein the one- dimensional size of the top surface of the second non-pyramidal texture structure is greater than or equal to 15 μm and less than or equal to 35 μm.

4. The semiconductor substrate according to claim 1, wherein the first non-pyramidal texture structure comprises:
 two or more first substructures that are at least partially stacked on one another, and a one-dimensional size of a top surface of the outermost first substructure is greater than or equal to 5 μm and less than or equal to 12 μm, in a direction away from the back surface and perpendicular to the back surface; and
 two or more second substructures that are adjacent but not stacked on one another, and a one-dimensional size of a top surface of the second substructure away from the back surface is greater than or equal to 5 μm and less than or equal to 12 μm.

5. The semiconductor substrate according to claim 1, wherein the second non-pyramidal texture structure comprises:
 two or more third substructures that are at least partially stacked on one another, and a one-dimensional size of a top surface of the outermost third substructure is greater than or equal to 10 μm and less than or equal to 40 μm, in a direction away from the back surface and perpendicular to the back surface; and
 two or more fourth substructures that are adjacent but not stacked on one another, and a one-dimensional size of a top surface of the fourth substructure away from the back surface is greater than or equal to 10 μm and less than or equal to 40 μm.

6. The semiconductor substrate according to claim 1, wherein a dividing line is provided between the N-type conductive region and the P-type conductive region, and the N-type conductive region and/or the P-type conductive region are provided with holes close to the dividing line.

7. The semiconductor substrate according to claim 6, wherein the N-type conductive region and/or the P-type conductive region are provided with the holes having a distance of 5 μm to 15 μm away from the dividing line.

8. The semiconductor substrate according to claim 7, wherein the N-type conductive region and/or the P-type conductive region are provided with the holes having a distance of 5 μm to 10 μm away from the dividing line.

9. The semiconductor substrate according to claim 6, wherein a diameter of the hole ranges from 1 μm to 10 μm.

10. The semiconductor substrate according to claim 9, wherein the diameter of the hole ranges from 1 μm to 5 μm.

11. The semiconductor substrate according to claim 6, wherein a depth of the hole ranges from 0.5 μm to 2 μm.

12. The semiconductor substrate according to claim 6, wherein a gap between two adjacent N-type conductive regions or between two adjacent P-type conductive regions ranges from 0.8 mm to 1.2 mm; the N-type conductive regions distributed on the back surface of the semiconductor substrate account for 50% to 85% of the back surface; and the P-type conductive regions distributed on the back surface of the semiconductor substrate account for 15% to 50% of the back surface.

13. The semiconductor substrate according to claim 1, wherein a shape of the polygonal plane includes at least one of a rhombus, a square, a trapezoid, an approximate rhombus, an approximate square, or an approximate trapezoid.

14. The semiconductor substrate according to claim 1, wherein the semiconductor substrate is a P-type crystalline silicon substrate.

15. A solar cell, comprising:
 a semiconductor substrate, including:
 a back surface including N-type conductive regions and P-type conductive regions formed thereon,
 wherein the N-type conductive regions are provided with first non-pyramidal texture structures, and the P-type conductive regions are provided with second non-pyramidal texture structures; and each of the first non-pyramidal texture structures and the second non-pyramidal texture structures is formed as a shape resulting from destruction of a spire of a pyramidal microstructure that protrudes towards a direction away from the back surface of the semiconductor substrate;
 a top surface of the first non-pyramidal texture structure is a polygonal plane and a top surface of the second non-pyramidal texture structure is a polygonal plane, and a one-dimensional size of the top surface of the first non-pyramidal texture structure in a dimension is less than a one-dimensional size of the top surface of the second non-pyramidal texture structure in the same dimension, the one-dimensional size being a length, a width, a diagonal length, or a circular diameter of the top surface; and
 the one-dimensional size of the top surface of the first non-pyramidal texture structure is greater than or equal to 5 μm and less than or equal to 12 μm; and the one-dimensional size of the top surface of the second non-pyramidal texture structure is greater than or equal to 10 μm and less than or equal to 40 μm;
 a tunnel oxide layer formed over the N-type conductive region;
 a local back surface field formed in the P-type conductive region;

a polysilicon film layer formed over a side of the tunnel oxide layer facing away from the semiconductor substrate;

an eutectic layer formed in the local back surface field;

a back-surface passivation layer formed over a side of the polysilicon film layer facing away from the tunnel oxide layer and over the P-type conductive region;

a first electrode passing through the back-surface passivation layer to form ohmic contact with the local back surface field; and a second electrode passing through the back-surface passivation layer to form ohmic contact with the polysilicon film layer.

16. The solar cell according to claim 15, further comprising:

a front-surface passivation layer and an antireflection layer formed over a front surface of the semiconductor substrate and sequentially stacked in a direction away from the semiconductor substrate.

17. The solar cell according to claim 15, wherein the one-dimensional size of the top surface of the first non-pyramidal texture structure is greater than or equal to 7 μm and less than or equal to 10 μm.

18. The solar cell according to claim 15, wherein the one-dimensional size of the top surface of the second non-pyramidal texture structure is greater than or equal to 15 μm and less than or equal to 35 μm.

19. The solar cell according to claim 15, wherein a dividing line is provided between the N-type conductive region and the P-type conductive region, and the N-type conductive region and/or the P-type conductive region are provided with holes close to the dividing line.

20. A photovoltaic module, comprising:

a plurality of solar cells electrically connected into a solar cell string in a form of an entire cell or multiple-cut cells, wherein at least one of the plurality of solar cells includes:

a semiconductor substrate, including:

a back surface including N-type conductive regions and P-type conductive regions formed thereon, wherein the N-type conductive regions are provided with first non-pyramidal texture structures, and the P-type conductive regions are provided with second non-pyramidal texture structures; and each of the first non-pyramidal texture structures and the second non-pyramidal texture structures is formed as a shape resulting from destruction of a spire of a pyramidal microstructure that protrudes towards a direction away from the back surface of the semiconductor substrate;

a top surface of the first non-pyramidal texture structure is a polygonal plane and a top surface of the second non-pyramidal texture structure is a polygonal plane, and a one-dimensional size of the top surface of the first non-pyramidal texture structure in a dimension is less than a one-dimensional size of the top surface of the second non-pyramidal texture structure in the same dimension, the one-dimensional size being a length, a width, a diagonal length, or a circular diameter of the top surface; and the one-dimensional size of the top surface of the first non-pyramidal texture structure is greater than or equal to 5 μm and less than or equal to 12 μm; and the one-dimensional size of the top surface of the second non-pyramidal texture structure is greater than or equal to 10 μm and less than or equal to 40 μm;

a tunnel oxide layer formed over the N-type conductive region;

a local back surface field formed in the P-type conductive region;

a polysilicon film layer formed over a side of the tunnel oxide layer facing away from the semiconductor substrate;

an eutectic layer formed in the local back surface field;

a back-surface passivation layer formed over a side of the polysilicon film layer facing away from the tunnel oxide layer and over the P-type conductive region;

a first electrode passing through the back-surface passivation layer to form ohmic contact with the local back surface field; and a second electrode passing through the back-surface passivation layer to form ohmic contact with the polysilicon film layer.

* * * * *